United States Patent
Terada et al.

(10) Patent No.: US 7,187,573 B2
(45) Date of Patent: Mar. 6, 2007

(54) MEMORY CIRCUIT AND METHOD OF GENERATING THE SAME

(75) Inventors: Yutaka Terada, Hirakata (JP); Hironori Akamatsu, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 147 days.

(21) Appl. No.: 11/011,116

(22) Filed: Dec. 15, 2004

(65) Prior Publication Data
US 2005/0128818 A1    Jun. 16, 2005

(30) Foreign Application Priority Data
Dec. 15, 2003  (JP) .............................. 2003-416777

(51) Int. Cl.
*G11C 5/06* (2006.01)

(52) U.S. Cl. .................. 365/63; 365/191; 365/198; 365/230.03

(58) Field of Classification Search ................ 365/63, 365/191, 198, 230.03
See application file for complete search history.

(56) References Cited

U.S. PATENT DOCUMENTS 6,831,356 B2 * 12/2004 Terada et al. ............... 257/691

FOREIGN PATENT DOCUMENTS

| JP | 60-025251 | 2/1985 |
|---|---|---|
| JP | 63-091895 | 4/1988 |

* cited by examiner

*Primary Examiner*—Hoai V. Ho
(74) *Attorney, Agent, or Firm*—McDermott Will & Emery LLP

(57) ABSTRACT

A memory circuit 10 includes: a feed-through input terminal 13 for inputting a signal different from a signal to be inputted when reading and writing memory cells; an intermediate buffer circuit 14 provided between regions where the memory cells are arranged, for relaying the signal inputted through the feed-through input terminal 13; and a feed-through output terminal 15 for outputting the signal relayed by the intermediate buffer circuit 14. Connections between the feed-through input terminal 13 and the intermediate buffer circuit 14 and between the intermediate buffer circuit 14 and the feed-through output terminal 15 are established by feed-through wires 16, 17, respectively. The feed-through wires 16, 17 are not connected to either a wire to be used when reading and wiring the memory cells, or the memory cells.

6 Claims, 9 Drawing Sheets

MEMORY CIRCUIT AND METHOD OF GENERATING THE SAME

BACKGROUND OF THE INVENTION

1. Field of the Invention

The present invention relates to a memory circuit and a method of generating the memory circuit, and in particular to a memory circuit for use in a semiconductor integrated circuit in combination with logic circuits and a method of generating such a memory circuit.

2. Description of the Background Art

With advances in microfabrication technology, the performance of semiconductor integrated circuits is improving day by day. In recent video apparatuses and information communication apparatuses, in order to achieve a reduction in cost and power consumption of the system, generally, a large-capacity memory circuit is mounted on a semiconductor integrated circuit, and computation, such as image processing, is performed within the semiconductor integrated circuit. In addition, with an increase in complexity of the system, the capacity of the memory mounted on the semiconductor integrated circuit has been significantly increased. For these reasons, in semiconductor integrated circuits having logic circuits and memory circuits mounted thereon, such as system LSIs, the proportion of the area occupied by memory circuits in relation to the entire chip has been increasing.

An example of semiconductor integrated circuits having logic circuits and memory circuits mounted thereon, such as those described above, is described in Japanese Laid-Open Patent Publication No. 63-91895. The publication describes a semiconductor integrated circuit including RAMs (memory circuits) which are not provided with input and output buffers; a gate array (logic circuits) having a plurality of input and output buffers for the RAMs.

In a semiconductor integrated circuit having logic circuits and memory circuits mounted thereon, such as a system LSI, as the memory capacity to be included on the semiconductor integrated circuit increases, the layout becomes inefficient and the chip area increases, and accordingly the problem of increase in chip cost arises. With reference to FIG. 9, the problem will be described below.

FIG. 9 is a diagram illustrating a configuration of a conventional semiconductor integrated circuit. A semiconductor integrated circuit 91 shown in FIG. 9 is a system LSI which includes external connection terminals 92 each for establishing a connection to an external circuit; a logic circuit section 93; and two memory circuits 94. Note that FIG. 9 shows only those signal lines that are necessary for the following description. Although not shown in the drawing, each memory circuit 94 includes a memory cell array having arranged therein memory cells in a matrix form; and a peripheral circuit section for writing and reading the memory cell array.

In the semiconductor integrated circuit 91 shown in FIG. 9, in the case of connecting between the external connection terminals 92 and terminals of the logic circuit section 93, if the area of the memory circuits 94 is small, the connection can be established by short straight wires. However, if the area of the memory circuits 94 is large, the wires connecting between the external connection terminals 92 and the terminals of the logic circuit section 93 need to be passed through a narrow region sandwiched between the two memory circuits 94 in a winding manner, resulting in an increase in wire length. If the wire length is increased, the parasitic capacitance and the resistance component are increased, whereby distortion occurs in a signal propagating through the wire and the propagation speed of the signal is degraded. In order to increase the propagation speed of a signal even where the wire length is long, there is a need to arrange in the middle of the wires buffer circuits 95 having an amplification effect. However, the buffer circuit 95 is a circuit element including a transistor, and thus cannot be arranged at a location where the memory cells are arranged. Therefore, the wire connecting between the external connection terminal 92 and the logic circuit section 93 is connected to the buffer circuit 95 so as to route around the memory circuit 94. As described above, in the semiconductor integrated circuit 91, as the area of the memory circuits 94 increases, the layout becomes inefficient and the chip area increases, resulting in an increase in chip cost.

SUMMARY OF THE INVENTION

Therefore, an object of the present invention is to provide a memory circuit with which, when used in combination with logic circuits, inefficiency of the layout is minimized and a reduction in the length of wires on the chip is achieved, and a method of generating such a memory circuit.

The present invention has the following features to attain the object mentioned above. A memory circuit of the present invention is configured by additionally providing to a conventional memory circuit a feed-through input terminal for inputting a signal different from a signal to be inputted when reading and writing memory cells; an intermediate buffer circuit provided between regions where memory cells are arranged, for relaying the signal inputted through the feed-through input terminal; a feed-through output terminal for outputting the signal relayed by the intermediate buffer circuit; a first feed-through wire for connecting between the feed-through input terminal and the intermediate buffer circuit; and a second feed-through wire for connecting between the intermediate buffer circuit and the feed-through output terminal. The first and second feed-through wires are not connected to either a wire to be used when reading and writing the memory cells, or the memory cells. In this case, it is preferred that the intermediate buffer circuit have an ability to drive at least the second feed-through wire.

The memory circuit may further comprise an input-side buffer circuit provided in the vicinity of the feed-through input terminal and inserted along the first feed-through wire, and the input-side buffer circuit may have an ability to drive both a portion of the first feed-through wire from the input-side buffer circuit to the intermediate buffer circuit, and the intermediate buffer circuit. Alternatively, the memory circuit may further comprise an output-side buffer circuit provided in the vicinity of the feed-through output terminal and inserted along the second feed-through wire, and the intermediate buffer circuit may have an ability to drive both a portion of the second feed-through wire from the intermediate buffer circuit to the output-side buffer circuit, and the output-side buffer circuit.

An overall shape of the memory circuit may be rectangular, and the feed-through input terminal and the feed-through output terminal may be provided on opposite sides of the rectangular memory circuit. The first and second feed-through wires may connect the feed-through input terminal, the intermediate buffer circuit, and the feed-through output terminal substantially in a straight line.

A method of generating a memory circuit of the present invention comprises the steps of: inputting design specifications of the memory circuit, the design specifications including at least a feed-through direction; determining, based on the inputted design specifications, a configuration of the memory circuit; calculating loads of a first and a second feed-through wire; determining specifications of an intermediate buffer circuit based on the calculated loads; and generating the memory circuit in accordance with the determined configuration and specifications.

In the step of determining specifications of the intermediate buffer circuit, a size of the intermediate buffer circuit may be determined based on the calculated loads, or more preferably, a buffer circuit to be used as the intermediate buffer circuit may be selected, based on the calculated loads, from a plurality of buffer circuits having different drive capabilities and being prepared in advance.

In the step of determining specifications of the intermediate buffer circuit, the number of intermediate buffer circuits per row and an arrangement location of the intermediate buffer circuit(s) may be determined based on the calculated loads. Alternatively, in the step of determining specifications of the intermediate buffer circuit, a size of the input-side buffer circuit may be determined based on the calculated loads, and in the step of generating the memory circuit, the input-side buffer circuit of the determined size may be provided in the vicinity of the feed-through input terminal and inserted along the first feed-through wire.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
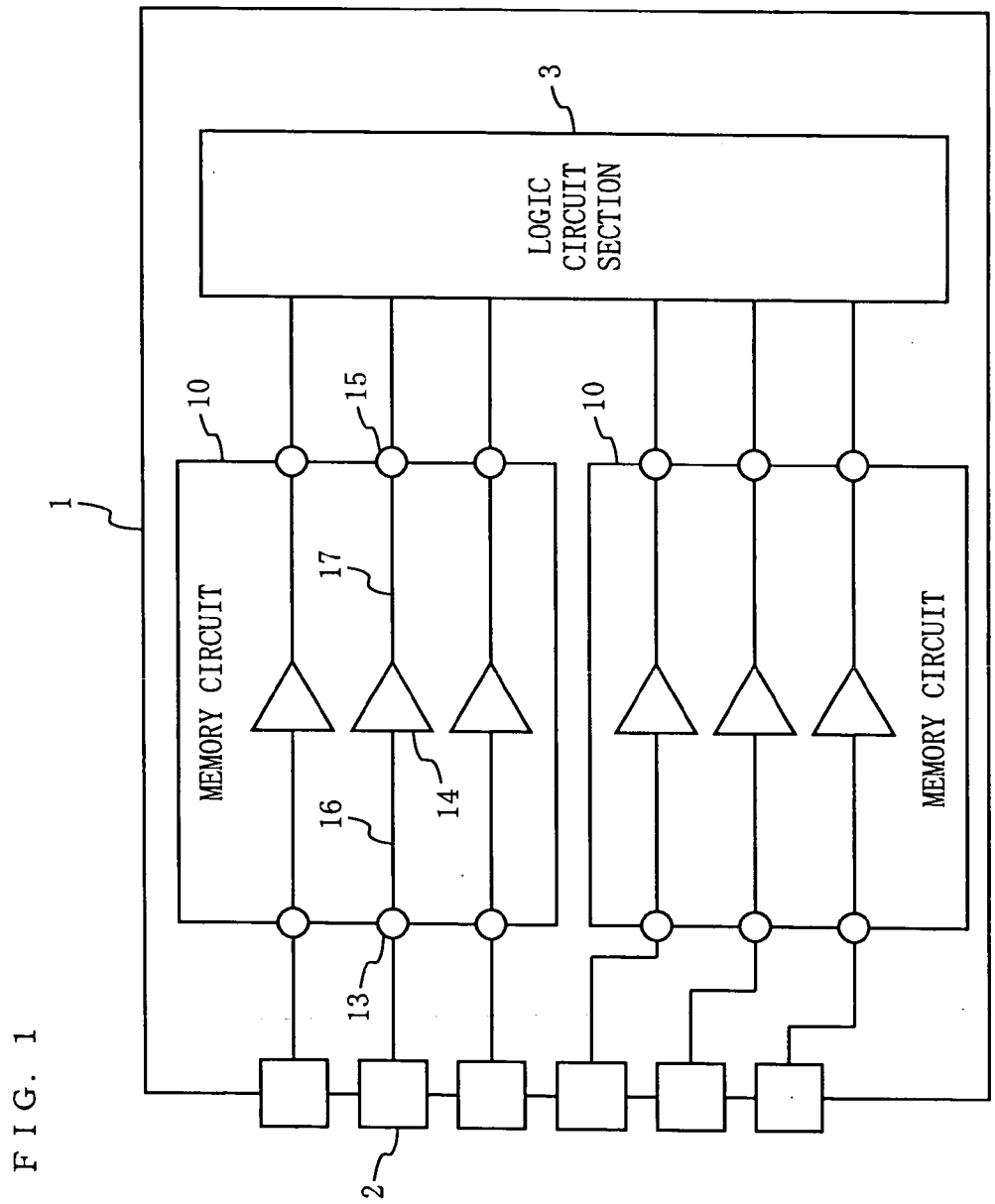
FIG. 1 is a diagram illustrating a configuration of a semiconductor integrated circuit having incorporated therein memory circuits, according to an embodiment of the present invention.

FIG. 1 is a diagram illustrating a configuration of a semiconductor integrated circuit having incorporated therein memory circuits according to an embodiment of the present invention. A semiconductor integrated circuit 1 shown in FIG. 1 is a system LSI which includes external connection terminals 2, a logic circuit section 3, and two memory circuits 10. The external connection terminals 2 are provided to connect between the semiconductor integrated circuit 1 and an external circuit (not shown). The memory circuit 10 is also called a "memory macro" and is typically generated using a memory compiler (a program for automatically generating the layout of a memory circuit based on the design specifications of the memory circuit).

The memory circuit 10 has the functions of storing data and reading and writing the stored data, as do conventional memory circuits. To support these functions, the memory circuit 10 has an address terminal, a data terminal, a control terminal, and the like. Note, however, that in FIG. 1 terminals provided to conventional memory circuits and wires connected to the terminals are omitted to simplify the drawing. This convention will be also employed in FIGS. 2, 3, and 5 (described later).

The memory circuits 10 each have a plurality of memory cells (not shown), a peripheral circuit section (not shown), feed-through input terminals 13, intermediate buffer circuits 14, feed-through output terminals 15, first feed-through wires 16, and second feed-through wires 17. The overall shape of the memory circuit 10 is rectangular, and the feed-through input terminal 13 and the feed-through output terminal 15 are provided on opposite sides of the memory circuit 10. The feed-through input terminals 13 are connected to corresponding external connection terminals 2 and the feed-through output terminals 15 are connected to corresponding input terminals of the logic circuit section 3.

The intermediate buffer circuits 14 are provided between a plurality of regions of the memory circuit 10, where the memory cells are arranged (the detail will be described later). The first feed-through wires 16 and the second feed-through wires 17 are provided in an upper layer of the memory circuit 10 so as to pass through the memory circuit 10. The first feed-through wire 16 connects between the feed-through input terminal 13 and an input terminal of the intermediate buffer circuit 14. The second feed-through wire 17 connects between an output terminal of the intermediate buffer circuit 14 and the feed-through output terminal 15. The first feed-through wire 16 and the second feed-through wire 17 are not connected to either the wire to be used when reading and writing the memory cells, or the memory cells. In this manner, by the first feed-through wire 16 and the second feed-through wire 17, a signal unrelated to the operation of the memory circuit 10 is allowed to pass through the memory circuit 10.

Figure 9:
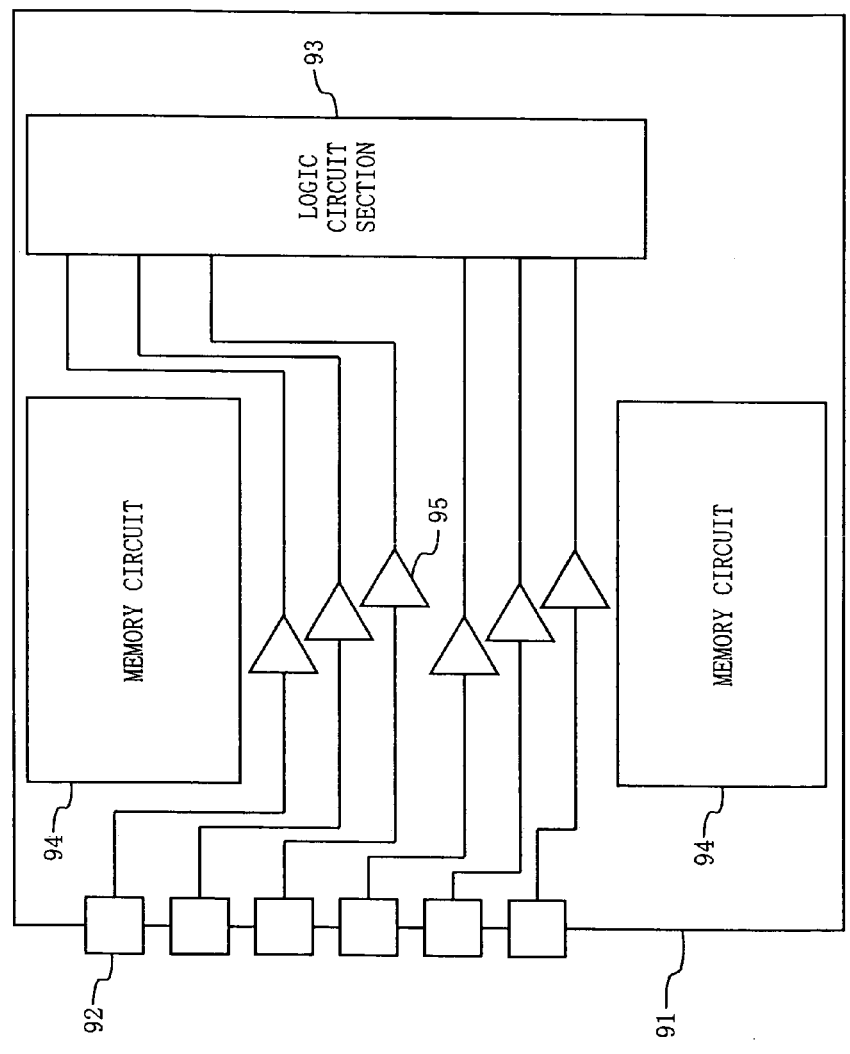
FIG. 9 is a diagram illustrating a configuration of a conventional semiconductor integrated circuit.

In the semiconductor integrated circuit 1 having the memory circuits 10, a signal inputted from the external connection terminal 2 reaches an input terminal of the logic circuit section 3 through the feed-through input terminal 13, the first feed-through wire 16, the intermediate buffer circuit 14, the second feed-through wire 17, and the feed-through output terminal 15. Since the intermediate buffer circuit 14 has an amplification effect, the signal inputted from the external connection terminal 2 reaches the input terminal of the logic circuit section 3 with the signal being amplified by the intermediate buffer circuit 14. Further, the wire through which the signal propagates from the external connection terminal 2 to the logic circuit section 3 passes through the memory circuit 10, instead of routing around the memory circuit 10 as in the case of the conventional semiconductor integrated circuit (FIG. 9). Thus, the length of such a wire is shorter compared to the conventional case. Accordingly, by using the memory circuit 10 having the intermediate buffer circuits 14, a reduction in area and an increase in speed of the semiconductor integrated circuit 1 are achieved.

Figure 2:
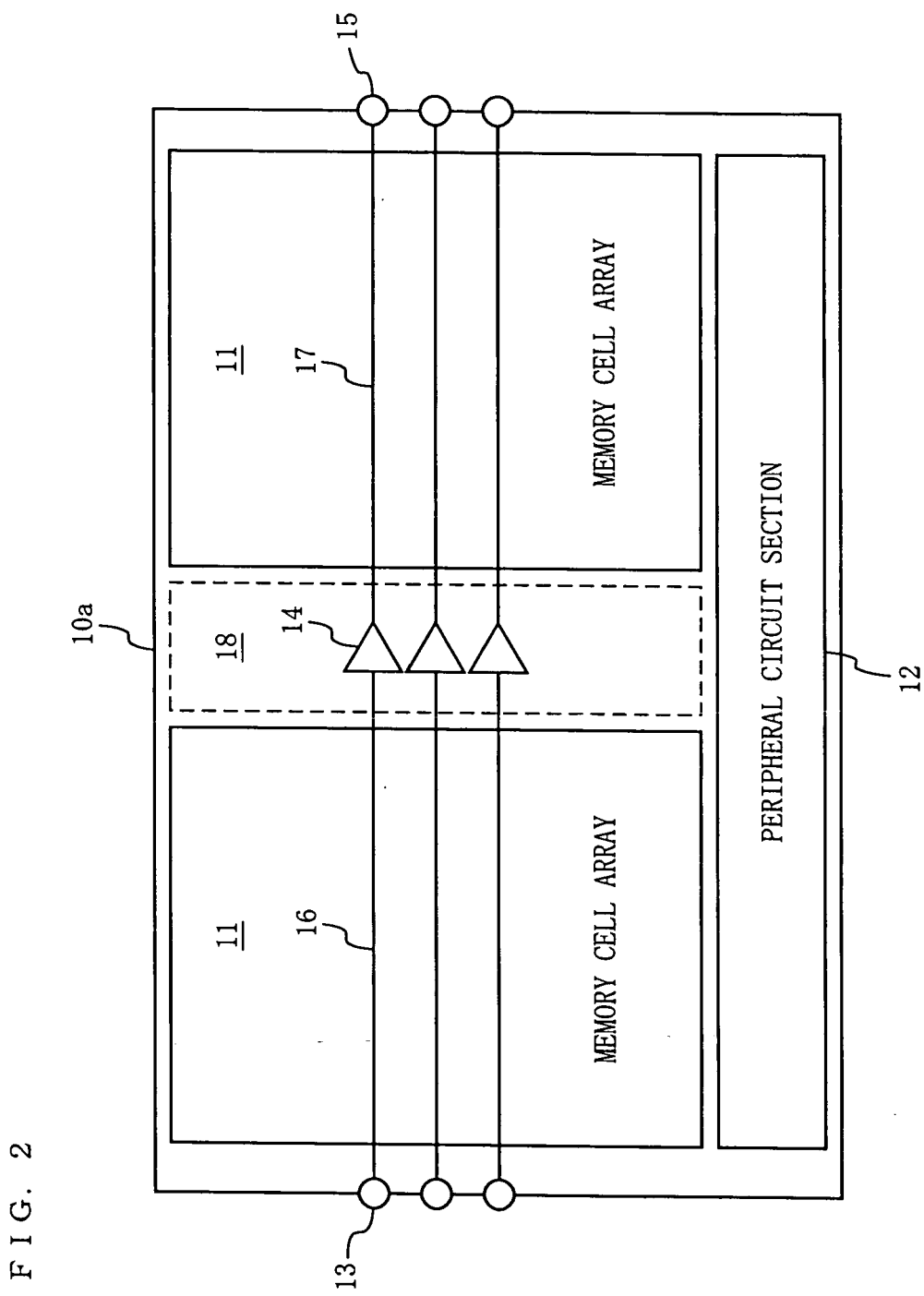
FIG. 2 is a diagram illustrating a configuration (first configuration) of the memory circuit according to the embodiment of the present invention.

FIG. 2 is a diagram illustrating a detailed configuration (first configuration) of the memory circuit 10. A memory circuit 10a shown in FIG. 2 includes a memory cell array 11, a peripheral circuit section 12, feed-through input terminals 13, intermediate buffer circuits 14, feed-through output terminals 15, first feed-through wires 16, and second feed-through wires 17. The memory cell array 11 is divided into a plurality of rectangular regions and a plurality of memory cells (several hundred or more) are separately arranged in the regions. In the memory circuit 10a, a plurality of memory cells are separately arranged in two rectangular regions of the same shape and size. A region which is sandwiched between the two rectangular regions where the memory cells are arranged, and which has no memory cells arranged therein (i.e., the region indicated by a dotted line) is hereinafter called the "no memory cell arrangement region 18".

When reading or writing a memory cell included in the memory cell array 11, an address signal, a data signal, and a control signal (none of them are shown) are inputted to the memory circuit 10a. Based on the inputted signals, the peripheral circuit section 12 reads or writes the memory cell included in the memory cell array 11. The peripheral circuit section 12 has logic circuits and is arranged in a region where the memory cell array 11 is not arranged (preferably in a region adjacent to the memory cell array 11). Note that although in the memory circuit 10a the peripheral circuit section 12 is not arranged in the no memory cell arrangement region 18, part of the peripheral circuit section 12 may be arranged in the no memory cell arrangement region 18.

The intermediate buffer circuits 14 are provided in the no memory cell arrangement region 18 (i.e., the region between the two rectangular regions which make up the entire memory cell array 11). In other words, in the case where a plurality of memory cells are divided into two groups and the memory cells of the two groups are arranged in two rectangular regions of the same shape and size, the intermediate circuits 14 are arranged in a region, where no memory cells are arranged, between the two rectangular regions. The reason that the intermediate buffer circuits 14 are arranged in the region where no memory cells are arranged is as follows. Because memory cells are designed such that the layout area is minimized when only memory cells are regularly arranged to improve integration density, if the intermediate buffer circuits 14 are incorporated in the memory cell array 11 where the memory cells are arranged, the layout efficiency of the memory circuit 10a degrades. In addition, the reason that the intermediate buffer circuits 14 are arranged in the region between the two rectangular regions which make up the entire memory cell array 11 (i.e., in the central portion of the entire memory cell array 11) is to maintain the load balance between the first feed-through wire 16 and the second feed-through wire 17.

A circuit (not shown) preceding the intermediate buffer circuit 14 needs to have the ability to drive both the wire connecting between the preceding circuit and the intermediate buffer circuit 14, and the intermediate buffer circuit 14. Thus, as the preceding circuit, a circuit is used which has the ability to drive at least the first feed-through wire 16 and the intermediate buffer circuit 14. In addition, the intermediate buffer circuit 14 needs to have the ability to drive both the wire connecting between the intermediate buffer circuit 14 and a circuit (not shown) subsequent to the intermediate buffer circuit 14, and the subsequent circuit. Thus, as the intermediate buffer circuit 14, a buffer circuit is used which has the ability to drive at least the second feed-through wire 17.

Note that although in the memory circuit 10a the intermediate buffer circuits 14 are arranged in the central portion of the entire memory cell array 11, the arrangement location of the intermediate buffer circuits 14 is not limited thereto. For example, depending on the length of the wire connecting between the circuit preceding the intermediate buffer circuit 14 and the intermediate buffer circuit 14, or the length of the wire connecting between the intermediate buffer circuit 14 and its subsequent circuit, a plurality of memory cells may be separately arranged in two rectangular regions of different sizes (e.g., two rectangular regions, with one region being twice the size of the other) and the intermediate buffer circuits 14 may be arranged between the two rectangular regions.

Figure 3:
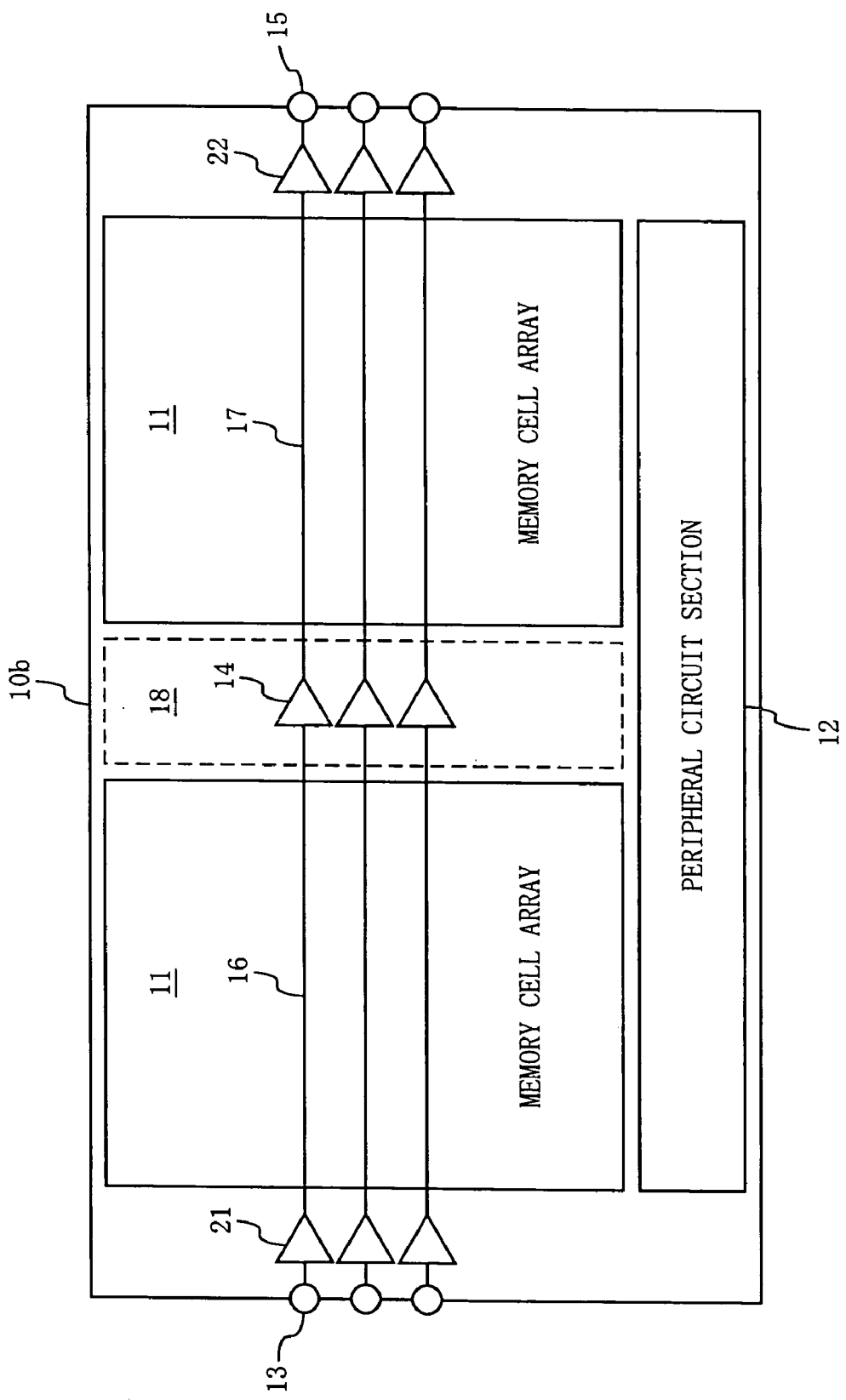
FIG. 3 is a diagram illustrating a configuration (second configuration) of the memory circuit according to the embodiment of the present invention.

FIG. 3 is a diagram illustrating a detailed configuration (second configuration) of the memory circuit 10 shown in FIG. 1. A memory circuit 10b shown in FIG. 3 is configured by additionally providing input-side buffer circuits 21 and output-side buffer circuits 22 to the memory circuit 10a (FIG. 2) of the first configuration. The input-side buffer circuit 21 is arranged on the first feed-through wire 16 and in the vicinity of the feed-through input terminal 13. The output-side buffer circuit 22 is arranged on the second feed-through wire 17 and in the vicinity of the feed-through output terminal 15. Connections between the feed-through input terminal 13 and an input terminal of the input-side buffer circuit 21 and between an output terminal of the output-side buffer circuit 22 and the feed-through output terminal 15 are each established by a short wire.

In the memory circuit 10b, the first feed-through wire 16 is made up of a short wire connecting between the feed-through input terminal 13 and the input terminal of the input-side buffer circuit 21 and a wire connecting between an output terminal of the input-side buffer circuit 21 and an input terminal of the intermediate buffer circuit 14. Similarly, the second feed-through wire 17 is made up of a wire connecting between an output terminal of the intermediate buffer circuit 14 and an input terminal of the output-side buffer circuit 22 and a short wire connecting between the output terminal of the output-side buffer circuit 22 and the feed-through output terminal 15.

As the input-side buffer circuit 21, a buffer circuit is used which has the ability to drive both a portion of the first feed-through wire 16 from the input-side buffer circuit 21 to the intermediate buffer circuit 14, and the intermediate buffer circuit 14. As the intermediate buffer circuit 14, a buffer circuit is used which has the ability to drive both a portion of the second feed-through wire 17 from the intermediate buffer circuit 14 to the output-side buffer circuit 22, and the output-side buffer circuit 22.

As described above, according to the memory circuit 10b, by providing the input-side buffer circuit 21, the load of the first feed-through wire 16 is removed from the input load of the feed-through input terminal 13, thereby reducing the input load of the feed-through input terminal 13. In addition, by providing the output-side buffer circuit 22, it becomes unnecessary for the intermediate buffer circuit 14 to drive a wire following, the feed-through output terminal 15, whereby the drive capability of the intermediate buffer circuit 14 can be made small. In addition, since the output-side buffer circuit 22 drives only the wire following the feed-through output terminal 15 and does not need to drive the second feed-through wire 17, the drive capability of the output-side buffer circuit 22 can be optimized without the need to consider the configuration of the memory circuit 10b. Thus, according to the memory circuit 10b, it is possible to optimize the drive capabilities of the intermediate buffer circuit 14, input-side buffer circuit 21, and output-side buffer circuit 22.

Note that the present embodiment describes an example where the external connection terminals 2 are connected to the feed-through input terminals 13 and the logic circuit section 3 is connected to the feed-through output terminals 15, but needless to say, any circuit can be connected to the feed-through input terminals 13 and the feed-through output terminals 15.

In order to allow the first feed-through wires 16 and the second feed-through wires 17 to pass through the memory circuit 10, the memory cell array 11 should be designed such that instead of using all available wiring layers, at least one wiring layer (normally, an upper wiring layer) is reserved for wiring the first feed-through wires 16 and the second feed-through wires 17. Generally, in most cases, in the upper layer of the memory circuit 10, the power supply and ground wires are wired in a mesh pattern. In this case, the first feed-through wires 16 and the second feed-through wires 17 should be wired in a higher layer than the layer of the power supply and ground wires, or should be arranged in the same layer as that of the power supply and ground wires so as not to cause a short circuit with the power supply and ground wires.

In the memory circuit 10 according to the present embodiment, a plurality of memory cells are separately arranged in two rectangular regions, and only one intermediate buffer circuit 14 is provided between a feed-through input terminal 13 and a feed-through output terminal 15. In another configuration, a plurality of memory cells may be separately arranged in N rectangular regions (where N is an integer greater than or equal to 3), and (N−1) intermediate buffer circuits 14 may be provided between a feed-through input terminal 13 and a feed-through output terminal 15 such that each intermediate buffer circuit 14 is connected between two of the regions.

Next, a method of generating the memory circuit according to the embodiment of the present invention is described. As described above, the memory circuit according to the embodiment of the present invention is typically generated by the computer executing a memory compiler. In the memory complier, plural types of memory circuit elements (e.g., memory cells and decoder circuits) are prepared in advance. The memory compiler selects the optimum combination from various element combinations based on the design specifications of the memory circuit inputted, and then automatically generates the layout of the memory circuit. The method of generating the memory circuit according to the embodiment of the present invention will be described below, in which for convenience of description the method is performed by the memory complier.

Figure 4:
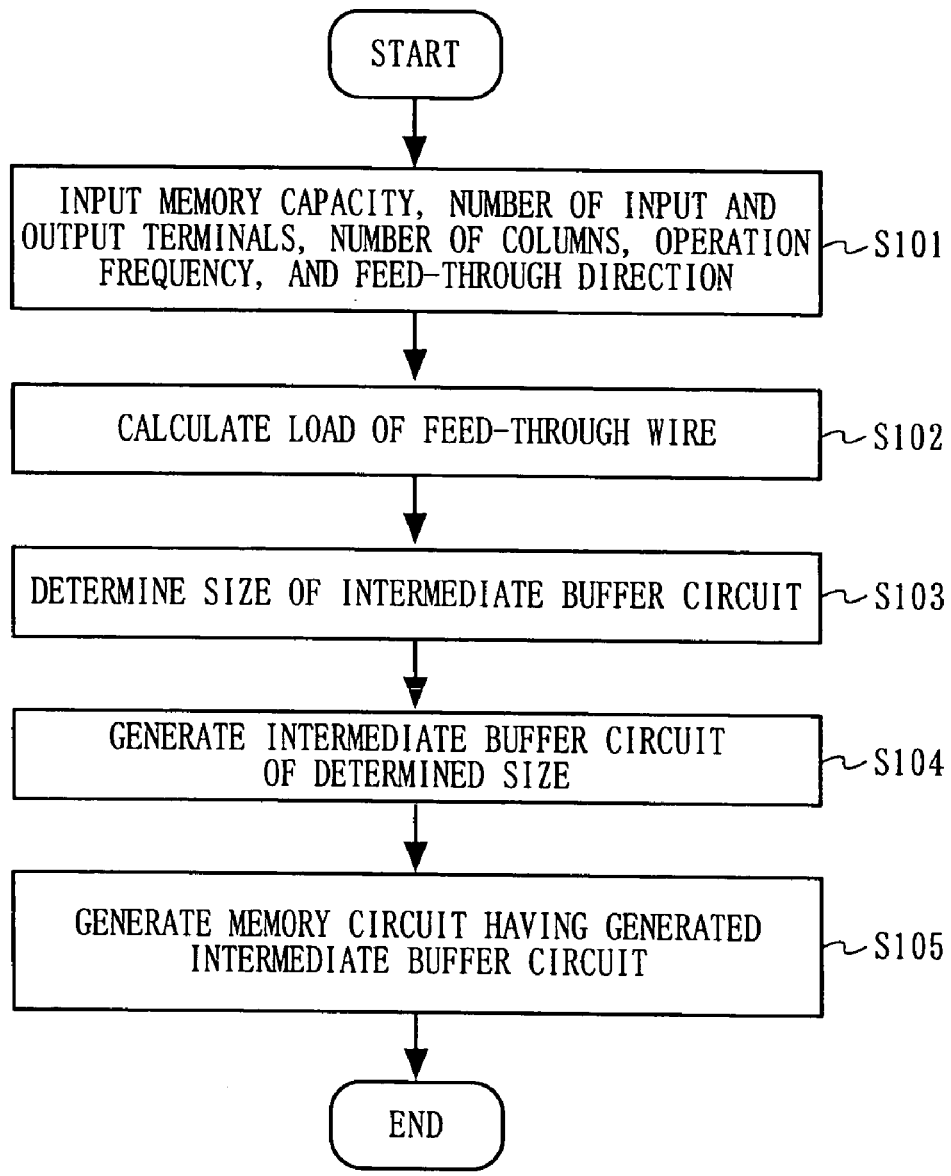
FIG. 4 is a flowchart showing a method (first method) of generating a memory circuit, according to the embodiment of the present invention.

FIG. 4 is a flowchart showing a method (first method) of generating a memory circuit. In the method shown in FIG. 4, first, a memory capacity, the number of input and output terminals, the number of columns, an operation frequency, and a feed-through direction are inputted to the memory compiler as the design specifications of the memory circuit (step S101). As the feed-through direction, a value such as "word line direction" or "bit line direction" is inputted. Note that among the parameters inputted at step S101, the feed-through direction is a parameter which is not used in conventional memory compilers.

Next, the memory compiler calculates the loads of feed-through wires based on the design specifications inputted at step S101 (step S102). At step S102, the configuration of the memory circuit is determined based on the inputted design specifications, and then based on the determined configuration the loads of the feed-through wires are calculated. Step S102 will be described in detail later.

Based on the loads of the feed-through wires calculated at step S102, the memory compiler determines the size of an intermediate buffer circuit as the specifications of the intermediate buffer circuit (step S103), and then generates an intermediate buffer circuit of the determined size (step S104).

Subsequently, based on the design specifications inputted at step S101, the memory compiler generates a memory circuit (the memory circuit according to the embodiment of the present invention) having the intermediate buffer circuit generated at step S104 (step S105). The process of step S105 is such that the process of generating the layout of an intermediate buffer circuit is added to an automatic layout process which is performed in conventional memory compilers.

If the size of the intermediate buffer circuit determined at step S103 is greater than a predetermined threshold value, the memory compiler may return to step S102 and change the configuration of the memory circuit, and then recalculate the loads of the feed-through wires, and thereafter, determine again the size of the intermediate buffer circuit at step S103. The memory compiler may also repeatedly perform steps S102 and 103 to determine the optimum value for the size of the intermediate buffer circuit.

Figure 5:
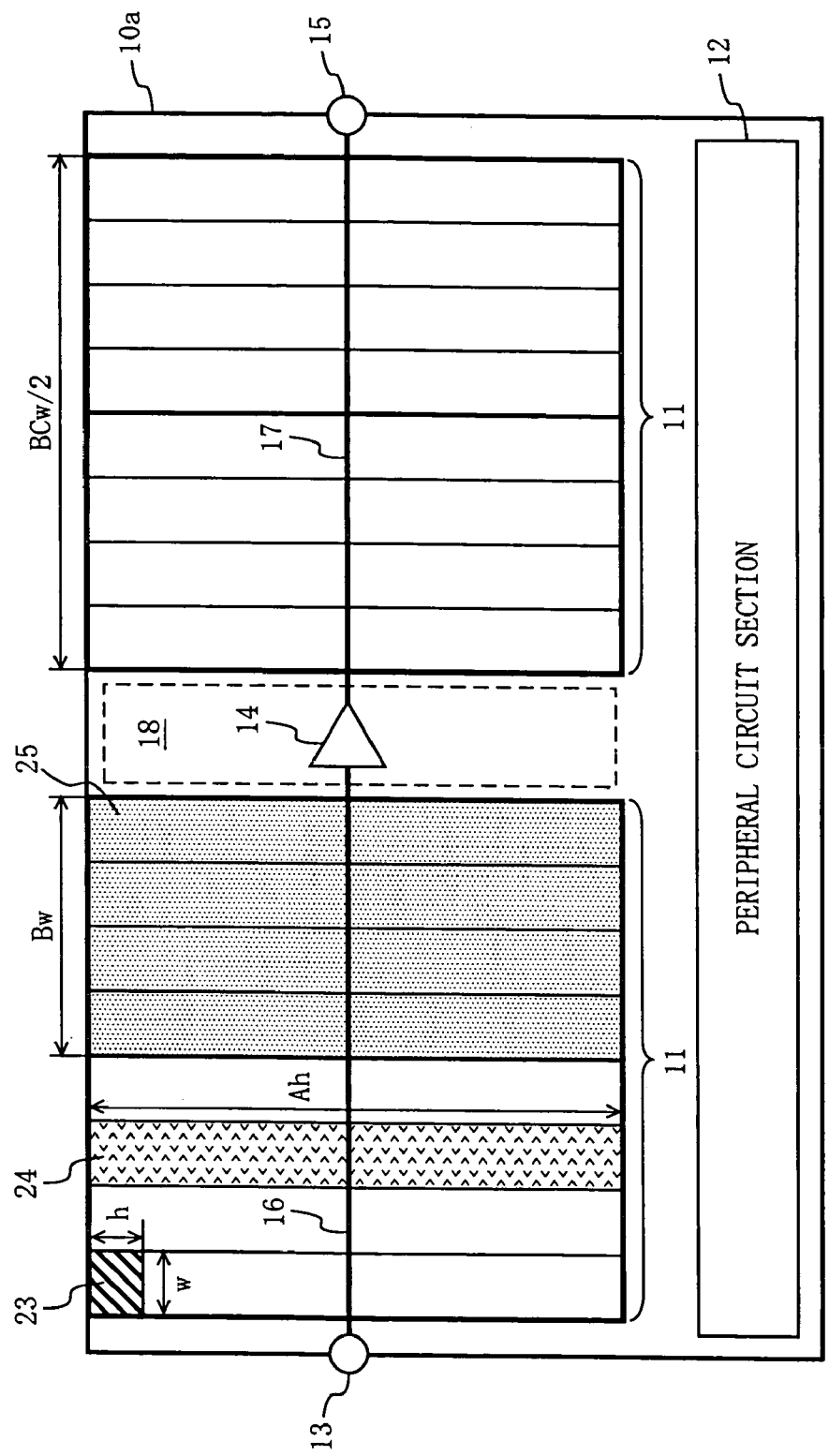
FIG. 5 is a diagram illustrating an exemplary memory circuit generated by the memory circuit generation method according to the embodiment of the present invention.

Step S102 shown in FIG. 4 will be described in detail below. Here, as an example case, the generation of a memory circuit 10a shown in FIG. 5 is described. As will be described below, at step S102, first, the configuration of the memory circuit is determined, the lengths of the feed-through wires are calculated, and then based on the calculated lengths the loads of the feed-through wires are calculated.

In a memory cell array 11, bit lines are wired in a given direction (a vertical direction in FIG. 5) and word lines are wired in a direction (a horizontal direction in FIG. 5) orthogonal to the given direction. A plurality of memory cells 23 (only a single memory cell 23 is shown in FIG. 5) divided into two groups are separately arranged in two rectangular regions which make up the entire memory cell array 11. An array of A memory cells 23 (where A is an integer greater than or equal to 2) which are arranged in the bit line direction (the vertical direction in FIG. 5) is called a "column 24". Where the number of input and output terminals of the memory circuit 10a is B (B is an integer greater than or equal to 1), a selection of B column(s) 24 arranged in the word line direction (the horizontal direction in FIG. 5) is called a "column selection 25". Where C is the value obtained by dividing the memory capacity of the memory circuit 10a by "A×B", by arranging C column-selection(s) 25 in the word line direction, the memory circuit 10a can be obtained.

Where the width of one memory cell (the size in the word line direction) is w and the height of one memory cell (the size in the bit line direction) is h, the width of the column 24 is w, the height of the column 24 is Ah, the width of the column selection 25 is Bw, the height of the column selection 25 is Ah, the width of the entire memory cell array 11 is BCw, and the height of the entire memory cell array 11 is Ah. In this manner, the configuration of the memory circuit 10a is determined based on the design specifications inputted at step S101.

Subsequently, the lengths of the feed-through wires are calculated taking into account the feed-through direction inputted at step S101. If the feed-through direction is the "word line direction", the length of each feed-through wire is BCw/2. If the feed-through direction is the "bit line direction", the length of each feed-through wire is Ah/2.

Based on the calculated lengths of the feed-through wires the parasitic capacitances of the feed-through wires are calculated, and then based on the calculated parasitic capacitances the loads of the feed-through wires are calculated. The loads thus calculated are treated as the loads of a first feed-through wire 16 and a second feed-through wire 17 and are referred to upon determining, at step S103, the size of the intermediate buffer circuit 14.

Figure 6:
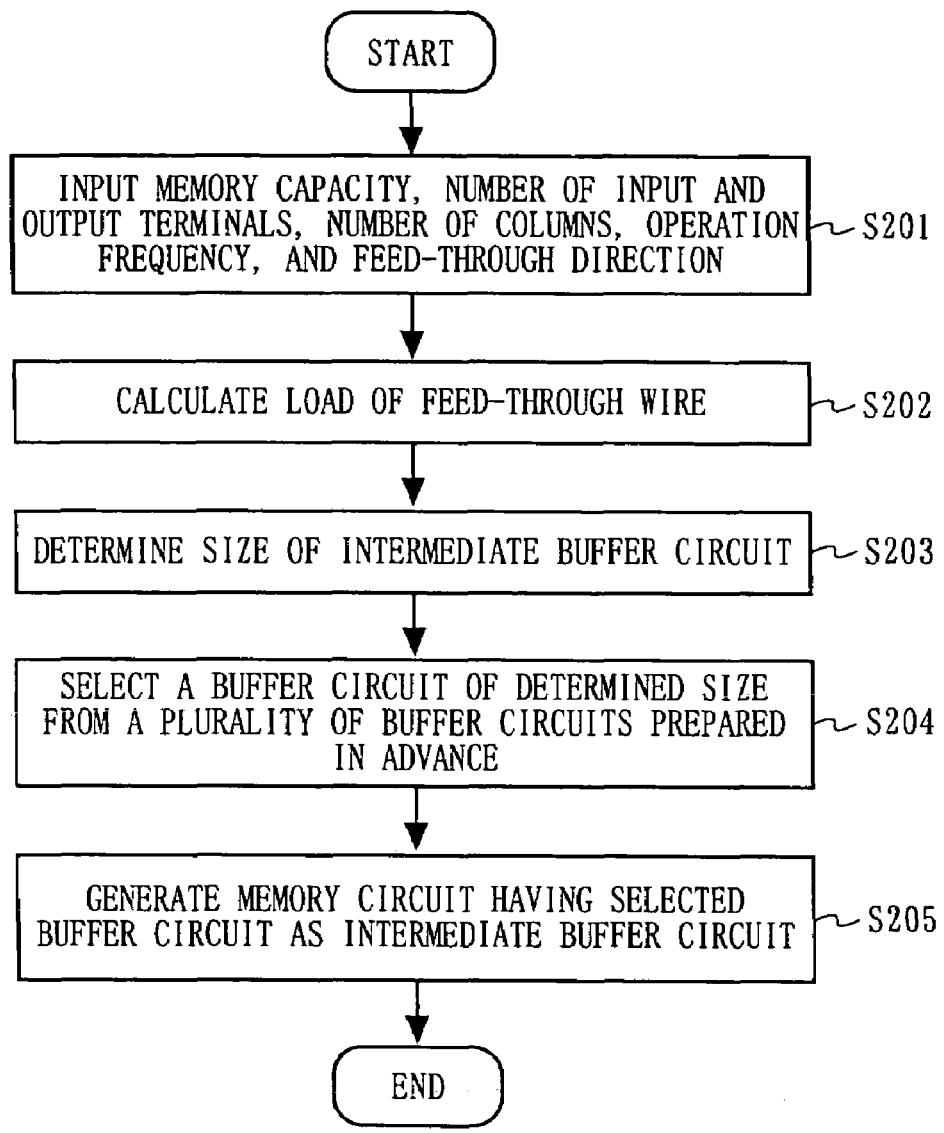
FIG. 6 is a flowchart showing a method (second method) of generating a memory circuit, according to the embodiment of the present invention.

FIG. 6 is a flowchart showing a method (second method) of generating a memory circuit. The second method is characterized in that a buffer circuit to be used as an intermediate buffer circuit is selected from buffer circuits prepared in advance. Before performing the second method, the memory compiler prepares in advance a plurality of buffer circuits having different drive capabilities, which can be used as the intermediate buffer circuit 14. In performing the second method, the memory compiler first performs the same processes as those of steps S101 to S103 included in the first method (steps S201 to S203). The memory compiler then selects a buffer circuit of the size determined at step S203 from the plurality of buffer circuits prepared in advance (step S204). Subsequently, the memory compiler generates a memory circuit (the memory circuit according to the embodiment of the present invention) having the buffer circuit selected at step S204 as the intermediate buffer circuit (step S205).

According to the above-described second method, although plural types of buffer circuits need to be prepared in advance, it is possible to omit, upon generation of the memory circuit, the process of accurately estimating the size of the intermediate buffer circuit and the process of generating the layout of the intermediate buffer circuit, and thus the memory circuit can be generated more easily than with the first method. Moreover, in many cases, standard logic cells used for designing logic circuits and the like can be used as the buffer circuits prepared in advance before performing the second method, and thus it is not necessary to generate a buffer circuit specially designed for the intermediate buffer circuit.

Figure 7:
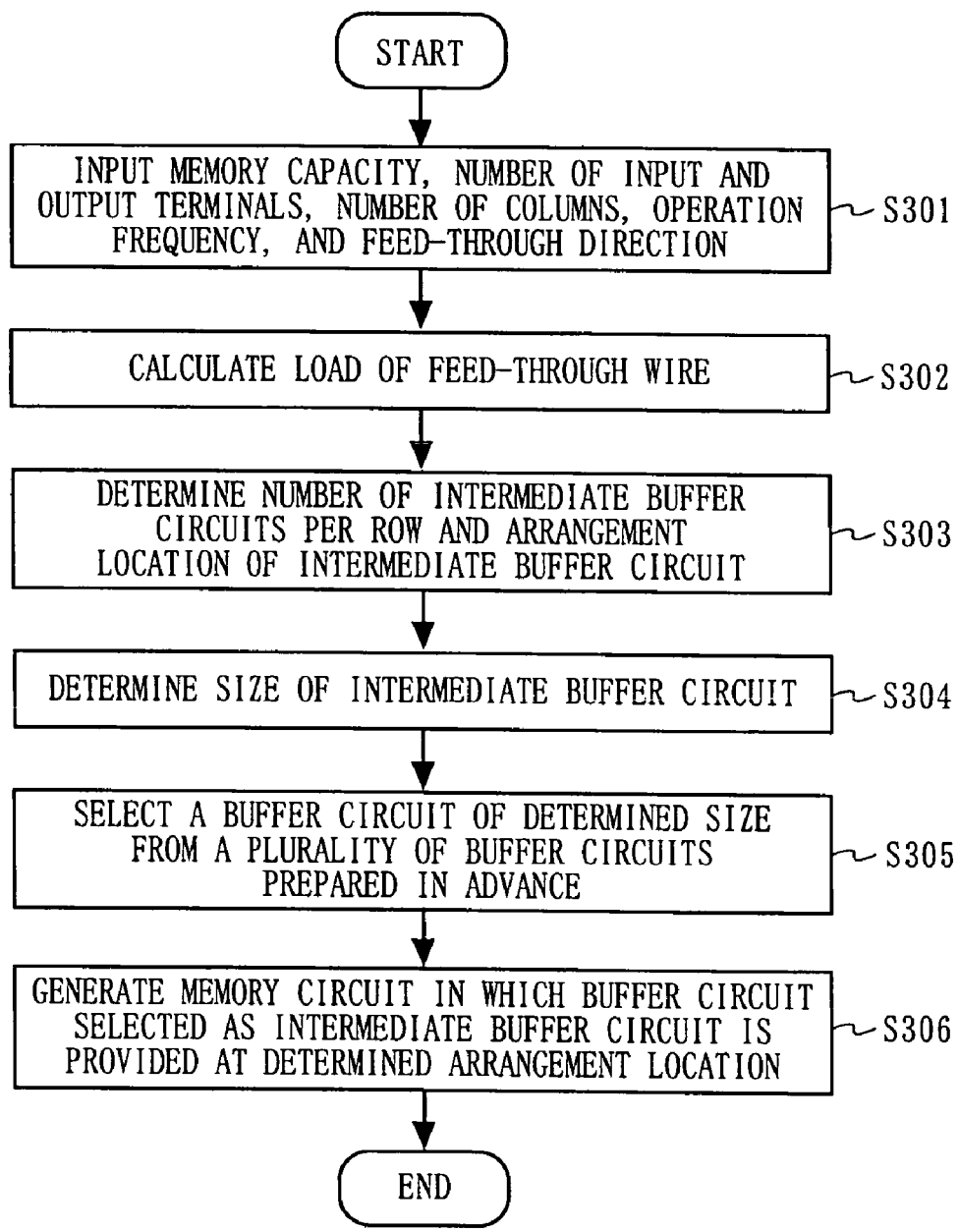
FIG. 7 is a flowchart showing a method (third method) of generating a memory circuit, according to the embodiment of the present invention.

FIG. 7 is a flowchart showing a method (third method) of generating a memory circuit. The third method is characterized in that the number of intermediate buffer circuits per row and the arrangement location of the intermediate buffer circuit(s) are determined based on the loads of the feed-through wires. In performing the third method, the memory compiler first performs the same processes as those of steps S201 and S202 included in the second method (steps S301 and S302). The memory compiler then determines the number of intermediate buffer circuits per row and the arrangement location of the intermediate buffer circuit(s) based on the loads of the feed-through wires calculated at step S302 (step S303). Such a determination is made in the following manner, for example. The upper limit Lmax of the load of one feed-through wire is predetermined, and the memory compiler determines the number N of feed through wires (N is an integer greater than or equal to 2) such that the load of each feed-through wire does not exceed the upper limit Lmax. Subsequently, the memory compiler divides the memory cell array into N rectangular regions of the same shape and size, and then arranges (N−1) intermediate buffer circuits in regions between the N rectangular regions, respectively. After step S303, the memory compiler performs the same processes as those of steps S203 and S204 included in the second method (steps S304 and S305). The memory compiler then generates a memory circuit (the memory circuit according to the embodiment of the present invention) in which the buffer circuit selected at step S305 as the intermediate buffer circuit is provided at the arrangement location determined at step S303 (step S306).

Figure 8:
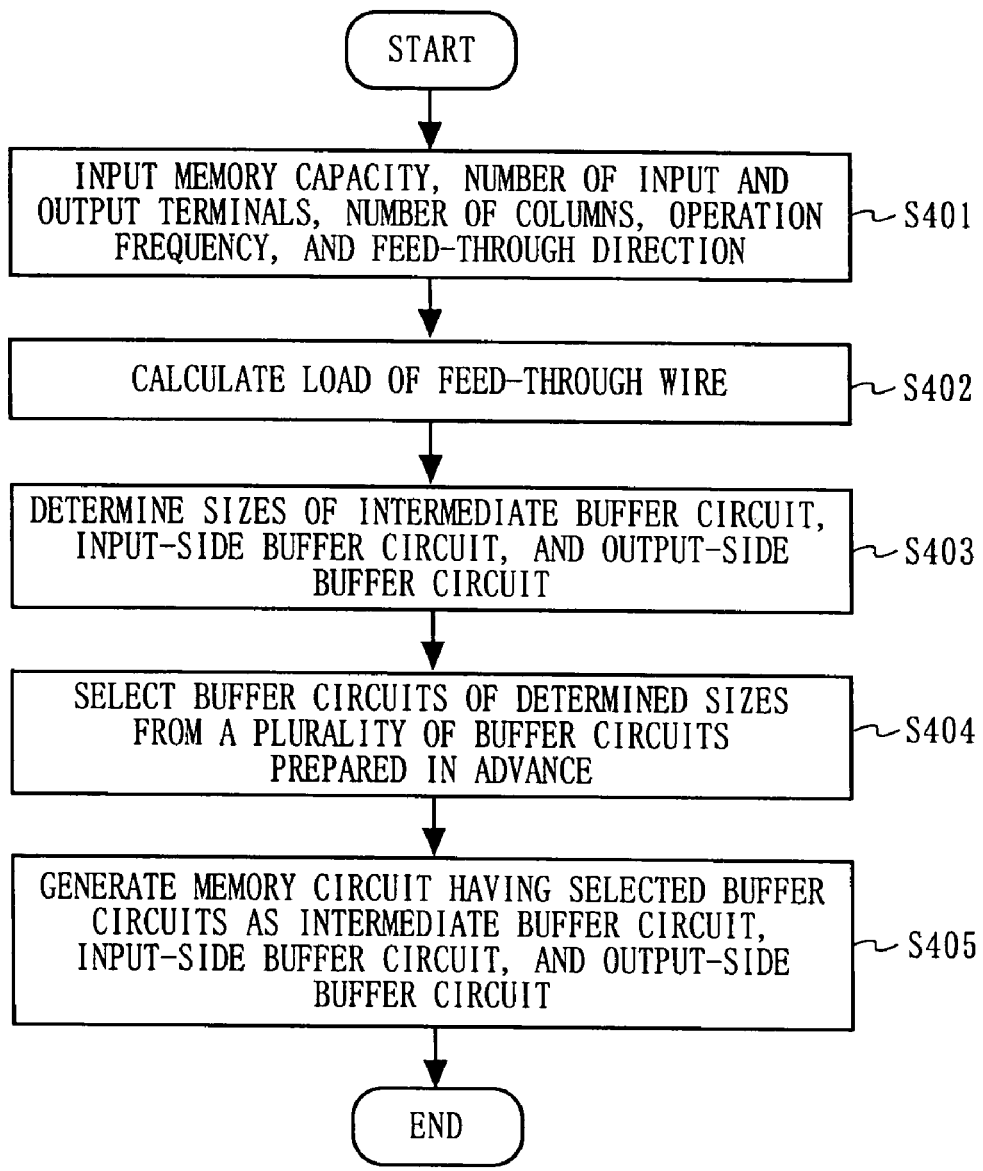
FIG. 8 is a flowchart showing a method (fourth method) of generating a memory circuit, according to the embodiment of the present invention.

FIG. 8 is a flowchart showing a method (fourth method) of generating a memory circuit. The fourth method is characterized in that the sizes of the input-side buffer circuit 21 and output-side buffer circuit 22, shown in FIG. 3, are calculated. In performing the fourth method, the memory compiler first performs the same processes as those of steps S201 and S202 included in the second method (steps S401 and S402). Subsequently, the memory compiler calculates the sizes of the intermediate buffer circuit 14, input-side buffer circuit 21, and output-side buffer circuit 22 based on the loads of the feed-through wires calculated at step S402 (step S403). The memory compiler then selects buffer circuits of the sizes determined at step S403 from buffer circuits prepared in advance (step S404). The memory compiler generates a memory circuit (the memory circuit according to the embodiment of the present invention) having the buffer circuits selected at step S404 as the intermediate buffer circuit 14, the input-side buffer circuit 21, and the output-side buffer circuit 22 (step S405).

Note that the memory compiler may also determine, at step S403, whether to provide the input-side buffer circuit 21 and switch, at step S405, between provision and non-provision of the input-side buffer circuit 21 in accordance with the determination at step S403. Alternatively, at step S401, as the design specifications of the memory circuit, the parameter "whether or not to provide the input-side buffer circuit" may be inputted to the memory compiler and the memory compiler may switch, at step S405, between the provision and non-provision of the input-side buffer circuit 21 in accordance with the parameter "whether or not to provide the input-side buffer circuit" inputted at step S401. The same applies to the output-side buffer circuit 22.

Further, at step S401, as the design specifications of the memory circuit, an output load may be inputted to the memory compiler and the memory compiler may determine, at step S403, the size of the output-side buffer circuit 22 in accordance with the output load inputted at step S401.

According to the memory circuit of the embodiment of the present invention, the signal unrelated to the operation of the memory circuit is allowed to pass through the memory circuit. In addition, this signal reaches the feed-through output terminal with the signal being amplified by the amplification effect of the intermediate buffer circuit. Further, since this signal passes through the memory circuit instead of routing around the memory circuit, the length of the wire through which the signal propagates is shorter compared to conventional cases. Therefore, by using the memory circuit of the present invention, a reduction in area and an increase in speed of the semiconductor integrated circuit are achieved. As a result of achieving a reduction in area of the semiconductor integrated circuit, the yield is improved and accordingly the fabrication cost of the semiconductor integrated circuit can be reduced.

By providing an input-side buffer circuit, the input load of a feed-through input terminal can be reduced. In addition, by providing an output-side buffer circuit, the drive capability of an output-side buffer circuit can be optimized.

By adopting the configuration that the feed-through input terminal and the feed-through output terminal are provided on opposite sides of the memory circuit, or the configuration that the first and second feed-through wires connect the feed-through input terminal, intermediate buffer circuit, and feed-through output terminal substantially in a straight line, the effects of a reduction in area and an increase in speed of the semiconductor integrated circuit can be enhanced.

As described above, according to the method of generating a memory circuit of the embodiment of the present invention, a memory circuit which realizes a reduction in area and an increase in speed of the semiconductor integrated-circuit can be easily generated. In particular, by determining the number of intermediate buffer circuits per row and the size and arrangement location of the intermediate buffer circuit (s), or by determining the size of an input-side buffer circuit, based on the loads of feed-through wires, memory circuits having various configurations and characteristics can be easily generated.

The memory circuit of the present invention realizes a reduction in area and an increase in speed of the semiconductor integrated circuit, and thus can be applied to various types of semiconductor integrated circuits having logic circuits and memory circuits mounted thereon, such as system LSIs. In addition, the method of generating a memory circuit of the present invention can be applied to memory compilers and the like.

While the invention has been described in detail, the foregoing description is in all aspects illustrative and not restrictive. It is understood that numerous other modifications and variations can be devised without departing from the scope of the invention.

What is claimed is:

1. A memory circuit comprising:
    a plurality of memory cells separately arranged in a plurality of regions;
    a peripheral circuit for reading and writing the memory cells;
    a feed-through input terminal for inputting a signal different from a signal to be inputted when reading and writing the memory cells;
    an intermediate buffer circuit provided between the plurality of regions, for relaying the signal inputted through the feed-through input terminal;
    a feed-through output terminal for outputting the signal relayed by the intermediate buffer circuit;
    a first feed-through wire for connecting between the feed-through input terminal and the intermediate buffer circuit; and
    a second feed-through wire for connecting between the intermediate buffer circuit and the feed-through output terminal, wherein
    the first and second feed-through wires are not connected to either a wire to be used when reading and writing the memory cells, or the memory cells.

2. The memory circuit according to claim 1, wherein the intermediate buffer circuit has an ability to drive at least the second feed-through wire.

3. The memory circuit according to claim 1, further comprising:
    an input-side buffer circuit provided in the vicinity of the feed-through input terminal and inserted along the first feed-through wire, wherein
    the input-side buffer circuit has an ability to drive both a portion of the first feed-through wire from the input-side buffer circuit to the intermediate buffer circuit, and the intermediate buffer circuit.

4. The memory circuit according to claim 1, further comprising:
    an output-side buffer circuit provided in the vicinity of the feed-through output terminal and inserted along the second feed-through wire, wherein
    the intermediate buffer circuit has an ability to drive both a portion of the second feed-through wire from the intermediate buffer circuit to the output-side buffer circuit, and the output-side buffer circuit.

5. The memory circuit according to claim 1, wherein
    an overall shape of the memory circuit is rectangular, and
    the feed-through input terminal and the feed-through output terminal are provided on opposite sides of the rectangular memory circuit.

6. The memory circuit according to claim 1, wherein the first and second feed-through wires connect the feed-through input terminal, the intermediate buffer circuit, and the feed-through output terminal substantially in a straight line.

* * * * *